United States Patent
Sun et al.

(10) Patent No.: US 6,893,983 B2
(45) Date of Patent: May 17, 2005

(54) METHOD FOR DEPOSITING A VERY HIGH PHOSPHORUS DOPED SILICON OXIDE FILM

(75) Inventors: Jian Sun, Singapore (SG); Hing Ho Au, Singapore (SG); Yew Hoong Phang, Singapore (SG)

(73) Assignee: TECH Semiconductor Singapore Pte Ltd., Singapore (SG)

( * ) Notice: Subject to any disclaimer, the term of this patent is extended or adjusted under 35 U.S.C. 154(b) by 543 days.

(21) Appl. No.: 09/950,755

(22) Filed: Sep. 13, 2001

(65) Prior Publication Data

US 2004/0119145 A1 Jun. 24, 2004

(51) Int. Cl.[7] .............................................. H01L 21/44
(52) U.S. Cl. ........................ 438/784; 438/778; 438/783
(58) Field of Search ................................ 438/761, 763, 438/778, 783–784; 427/255.23, 255.28, 255.29, 255.37, 255.38

(56) References Cited

U.S. PATENT DOCUMENTS

| | | | |
|---|---|---|---|
| 5,262,336 A | 11/1993 | Pike, Jr. et al. | 437/31 |
| 5,284,800 A | 2/1994 | Lien et al. | 437/195 |
| 5,494,859 A | 2/1996 | Kapoor | 437/235 |
| 5,527,719 A | 6/1996 | Park et al. | 437/25 |
| 5,814,377 A | 9/1998 | Robles et al. | 427/579 |
| 5,899,725 A | 5/1999 | Harshfield | 438/398 |
| 6,013,584 A | 1/2000 | M'Saad | 438/783 |
| 6,071,771 A | 6/2000 | Schuegraf | 438/240 |
| 6,090,725 A * | 7/2000 | Yang et al. | 438/784 |
| 6,114,216 A | 9/2000 | Yieh et al. | 438/424 |
| 6,153,540 A * | 11/2000 | Lou et al. | 438/778 |
| 6,162,709 A | 12/2000 | Raoux et al. | 438/513 |
| 6,169,040 B1 | 1/2001 | Mifuji et al. | 438/763 |
| 6,197,689 B1 | 3/2001 | Tabara | 438/738 |
| 2003/0129826 A1 * | 7/2003 | Werkhoven et al. | 438/627 |

* cited by examiner

*Primary Examiner*—Carl Whitehead, Jr.
*Assistant Examiner*—Thanhha Pham
(74) *Attorney, Agent, or Firm*—Arent Fox

(57) ABSTRACT

A thermal activated SACVD method for depositing a phosphorus oxide layer onto a silicon oxide wafer comprising the steps of: loading an SACVD device with a silicon oxide wafer; depositing a phosphorus doped oxide (PSG) layer on the USG layer using pure oxygen and a phosphorus and silicon source; purging the SACVD device; and depositing a boron and phosphorus doped oxide (BPSG) layer on the PSG layer.

9 Claims, 7 Drawing Sheets

METHOD FOR DEPOSITING A VERY HIGH PHOSPHORUS DOPED SILICON OXIDE FILM

BACKGROUND OF THE INVENTION

1. Field of the Invention

The present invention relates to methods for depositing doped silicon oxide films onto the surface of an object. In particular, the present invention relates to chemical vapor deposition (CVD) and sub-atmospheric chemical vapor deposition (SACVD) methods for depositing a very high phosphorous doped silicon oxide film onto the surface of a silicon wafer.

2. Description of the Prior Art

One of the primary steps in the fabrication of modern semiconductor devices is the formation of thin films on a semiconductor substrate by chemical reaction of gasses. A process used to deposit a wide variety of metal and ceramic films onto the surface of an object, such as a silicon wafer is chemical vapor deposition, commonly referred to as "CVD." In the fabrication of semiconductor devices, CVD is used to form numerous conductive device regions and layers in or on a semiconductor substrate. These underlying regions or layers must then be isolated and connected to form circuits and devices. To isolate these regions and areas, an interlayer dielectric is formed over those regions. Devices within the semiconductor are further isolated or separated via methods such as etching. During an etching process, layers of oxide are removed to create trenches between devices, such as via argon sputtering, for example.

Over the last several decades, circuit and device sizes within semiconductor chips have decreased dramatically. About every two years, a chip is capable of holding twice as many circuits. The dramatic decrease in size of semiconductor device geometries reduces the acceptable tolerances of circuit design and chip manufacturing. Impurities and defects can therefore, have a greater affect on chip reliability and performance. Accordingly, the quality of integrated circuits becomes highly dependant on a number of factors, including the quality of the oxide layers, the quality and precision of the etching, the quality of the doping of various layers, etc.

Referring now to FIG. 1, depicted therein is the cross-section of a common Si—$SiO_2$ substrate within an annealed oxide stack which may be used as a semiconductor wafer upon which to embed a circuit. The Si—$SiO_2$ substrate 100, has $SiO_2$ regions 102, and is shown having standard oxide layers (an oxide stack) deposited thereon, such as an undoped silicon glass (USG) 108, a phosphorus doped silicon glass (phophosilicate glass or PSG) 108, and a boron and phosphorus doped silicon glass (borophophosilicate glass or BPSG) 104. An isolation trench or sub-micron hole 110 has been etched through the annealed oxide stack to the Si—$SiO_2$ substrate 100, such as via plasma etching process, in order to form a device, such as a transistor. As shown in FIG. 1, the sub-micron hole 110 travels from above the BPSG layer 104 and is cleanly etched to the surface of the Si—$SiO_2$ substrate, thus exposing the edges of the $SiO_2$ regions 102. Precision and placement of sub-micron holes is extremely important to the quality of the circuits on a chip.

A common problem in semiconductor manufacturing is the under-etching of such isolation trenches. Under-etching may cause devices to fail, to be less reliable, or to perform poorly. Thus, under-etching causes manufacturing of semiconductor chips to be more costly and time consuming, since a certain number of chips must be discarded because of the aforementioned problems.

Under-etching of oxide layers may be caused by a number of factors, including the quality of the oxide layers. One of the oxide layers that significantly affects the number of sub-micron holes that are under-etched is the PSG layer between the USG layer and the BPSG layer. The PSG layer is typically formed using a CVD technique, such as sub-atmospheric CVD (SACVD), plasma enhanced CVD (PECVD), etc. and is generally deposited using a number of doped sources in conjunction with an ozone ($O_3$) source, which allows for steady growth of a PSG layer onto a silicon wafer and has good gap filling capabilities. It has been found that by increasing the concentration of phosphorous in the PSG film, the number of under-etched sub-micron holes may be significantly reduced during the manufacture of semiconductor chips. Current methods of depositing a PSG layer are limited in the concentration of phosphorus in the PSG layer which is produced. Accordingly, there is a need for new and improved methods for depositing very high phosphorous doped silicon oxide films in order to improve chip manufacturing, device size, chip performance and quality, etc. To be viable, such methods should take advantage of current manufacturing equipment and techniques, so they may be implemented easily and without undue burden to current and prospective manufacturers. Also, such methods should be efficient and inexpensive when compared to current methods.

SUMMARY OF THE INVENTION

In view of the foregoing comments in view of the related art, it is an object of the present invention to solve the aforementioned problems. It is another object of the present invention to provide new and improved methods for depositing a very high concentration of phosphorus doped oxide film onto a substrate.

According to a preferred embodiment of the present invention, provided is a method for depositing a phosphorus doped silicon oxide film, comprising the steps of: loading a wafer into a chemical deposition device chamber; introducing a flow of carrier gas (e.g., helium gas) into the chamber and throttling the pressuring of the chamber to a first target pressure; heating the wafer to a target temperature; terminating the carrier gas flow into the chamber and introducing a flow of oxygen ($O_2$) into the chamber; introducing a flow of phosphorus (e.g., TEPO), a flow of silicon source gas (e.g., TEOS) and a flow of the carrier gas into the chamber; terminating the flow of phosphorus, silicon source gas, oxygen, and the carrier gas after a predetermined period of time; and purging the chamber.

According to another embodiment of the present invention, provided is a method for depositing a phosphorus doped silicon oxide film using a twin chamber sub-atmospheric chemical vapor deposition device (SACVD), comprising the steps of: loading a first wafer into a first chamber of the SACVD device and a second wafer into a second chamber of the SACVD device; starting a flow of a liquefied carrier gas into the first and second chambers and throttling the pressure of the first and second chambers to a first target pressure; heating the first and second wafers to a target temperature; terminating the flow of the liquefied carrier gas to the first and second chambers; starting a flow of pure oxygen into the first and second chambers and waiting a first predetermined period of time; starting a flow of liquefied gases into the first and second chamber, the liquefied gases including the liquefied carrier gas, triethylphosphate (TEPO) and tetraethylorthosilicate (TEOS); waiting for the phosphorus doped silicon oxide layer (PSG) to form on the wafer; terminating the flow of TEPO to the first and second chambers; changing the flow of pure oxygen to a flow of ozone; waiting for a undoped silicon oxide capping layer to form onto of the PSG layer; terminating the flow of the liquefied carrier gas and the TEOS; and purging the first and second chambers with an ozone-oxygen mix.

According to another embodiment of the present invention, provided is a thermal activated SACVD method for depositing a phosphorus oxide layer onto a silicon oxide wafer comprising the steps of: loading an SACVD device with a silicon oxide wafer; depositing a phosphorus doped oxide (PSG) layer on the USG layer using pure oxygen and a phosphorus and silicon source; purging the SACVD device; and depositing a boron and phosphorus doped silicon oxide (BPSG) layer on the PSG layer.

According to another embodiment of the present invention, provided is a method for depositing a phosphorus doped silicon oxide film onto a substrate using a twin chamber sub-atmospheric chemical deposition device (SACVD), comprising the steps of: loading a first wafer into a first chamber of the SACVD device and a second wafer into a second chamber of the SACVD device; starting the flow of a carrier gas into the first and second chambers and throttling the pressure of the first and second chambers to a first predetermined pressure; heating the first and second wafer to a predetermined temperature which is maintained throughout the method; diverting the flow of the carrier gas away from the first and second chambers into a foreline of the SACVD device; introducing a flow of oxygen into the first and second chambers; starting a flow of a silicon source and of a phosphorus source (i.e., chemical precursors) which are diverted into the foreline along with the carrier gas; diverting the silicon source, the phosphorus source and the carrier gas into the first and second chambers; after a first predetermined period of time, terminating the flow of the phosphorus source and changing the flow of oxygen to a flow of ozone; after a second predetermined period of time, diverting the flow of silicon source and the carrier gas into the foreline, and changing the ozone to an oxygen-ozone mix; after a third predetermined period of time, terminating the flow of the silicon source, the carrier gas and the oxygen-ozone mix; and pumping down the first and second chambers.

DETAILED DESCRIPTION OF THE PREFERRED EMBODIMENTS

Figure 1:
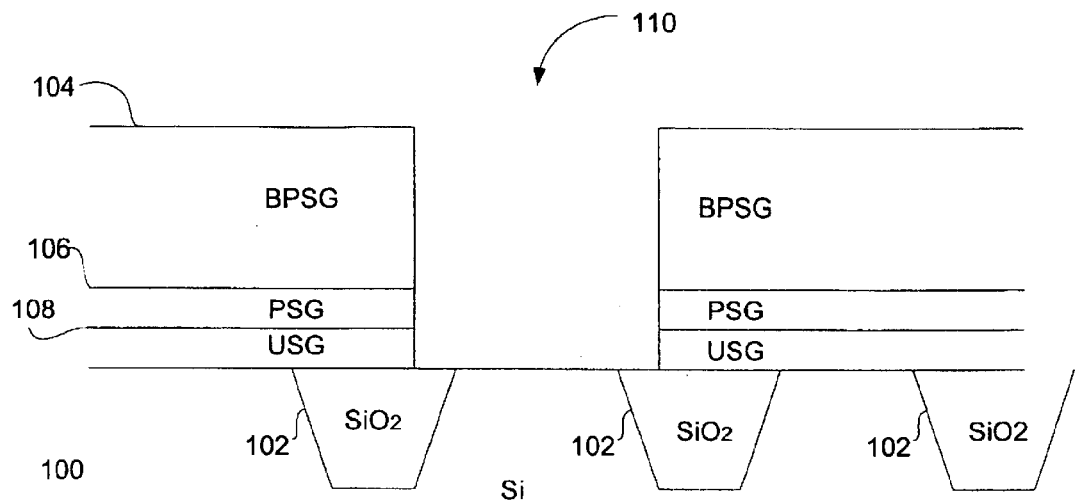
FIG. 1 illustrates a exemplary silicon oxide substrate having an annealed oxide stack deposited thereon showing a sub-micron hole etched to the surface of the $SiO_2$ substrate.

The present invention is now discussed with reference to the drawing figures that were briefly described above. Unless otherwise specified, like parts and processes are referred with like reference numbers.

Figure 2A:
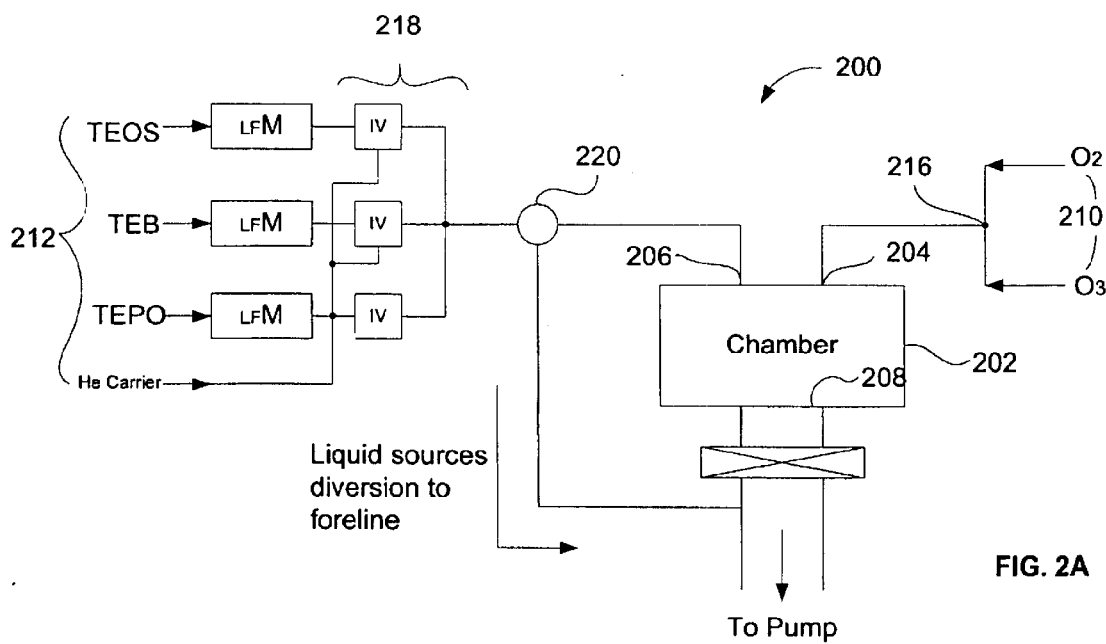
FIG. 2A illustrates a schematic of a exemplary sub-atmospheric chemical vapor deposition device.

FIG. 2A is a schematic of an exemplary chemical vapor deposition device that may be used to perform thermal activated sub-atmospheric chemical vapor deposition (SACVD) of a PSG layer and a BPSG layer onto the surface of an object, such as a silicon wafer. The SACVD device 200A includes a chamber 202 with inputs 204 and 206 and output or foreline 208 to a pump (not shown). An oxygen or oxide source 210 may include a oxygen source (hereinafter means substantially pure oxygen ($O_2$)) and an ozone source ($O_2$–$O_3$). Valve 216 is for initiating and terminating an oxygen and/or ozone flow to the chamber 202 via input 204. Liquefied gas sources 212 are chemical precursors and preferably include a silicate or silicon source TEOS (tetraethylorthosilicate), dopant sources such as a boron source TEB (triethylborate) and a phosphorus source TEPO (triethylphosphate), and a carrier gas (inert gas), preferably liquefied helium (He). Other dopant sources may also be used, such as TEP (triethyphosphite), TMOP (trimethylphosphate), TMP (trimethylphosphite), and other similar compounds.

Liquefied gas sources 212 may be vaporized by conventional boiler-type or bubbler type hot boxes (not shown) or input into chamber 202 by a liquid injection system. Liquefied gas sources 212 are fed through a series of valves 218 into a divert valve 220 which may divert the liquefied gas sources around the chamber 202 directly to the foreline 208 to the pump, or into the chamber via input 206. Valves 218 are used to control the initiation, termination, flow and mixing of the liquefied gases from liquefied gas source 212. A throttle valve 214 lies between the output of the chamber 208 and the pump and may be controlled to throttle the output of the chamber in order to increase, decrease or maintain pressure appropriately. Device 200A also includes appropriate controls and logic (not shown) to control the various valves and components of the device, and a heater (not shown) for heating the wafer and chamber. Device 200A is configured to control the input of the liquid gas sources TEOS, TEB, TEPO, the inert carrier gas, and the input of oxide source 210 into the chamber, as well as the temperature and the pressure of the chamber.

Figure 2B:
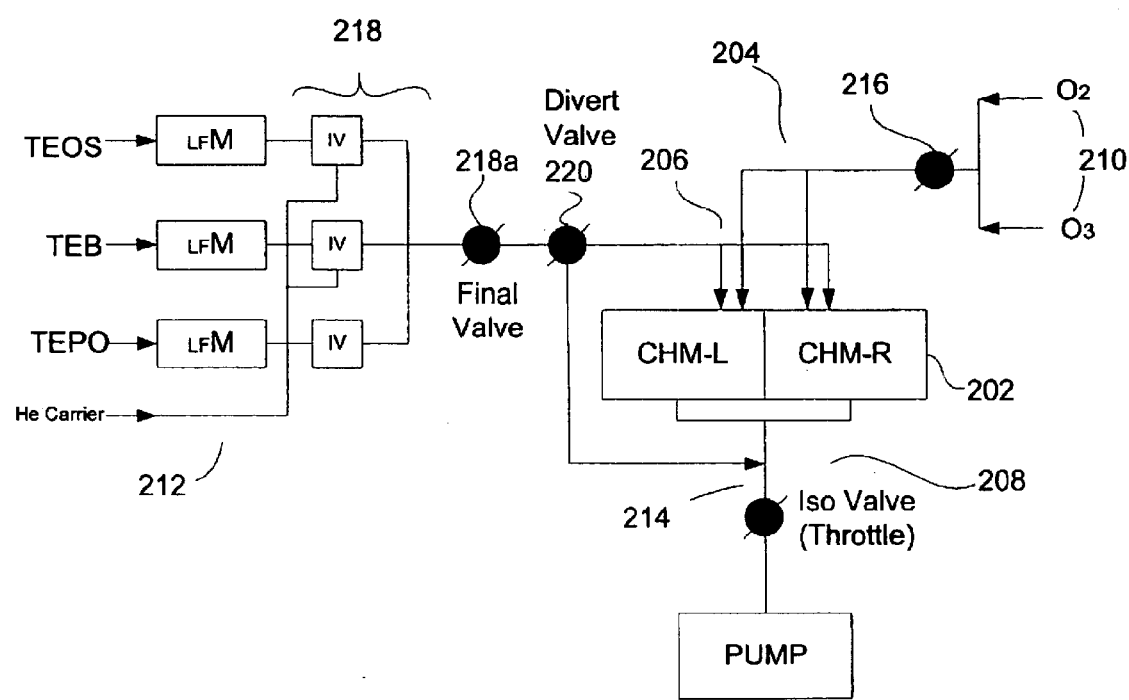
FIG. 2B illustrates a schematic of a exemplary twin-chamber sub-atmospheric chemical vapor deposition device.

Referring to FIG. 2B, shown therein is an exemplary twin chamber deposition device. The device 200B is similar to the device 200A shown in FIG. 2A except for a few differences, and like parts are shown with like numerals. One notable difference between the devices is that the chamber 202 of device 200B includes a left chamber CHM-L and a right chamber CHM-R, each with inputs 204 and 206 and output or foreline 208 to a pump 222. Also, liquefied gas sources 212 are fed through a series of valves 218 into a final valve 218a, into divert valve 220. Otherwise, devices 200A and 200B are very similar.

Devices 200A or 200B may be a commercially available CVD device, such as those manufactured and marketed by APPLIED MATERIALS,. INC. of Santa Clara, Calif., for example, APPLIED MATERIALS model no. 6380.

Figure 3:
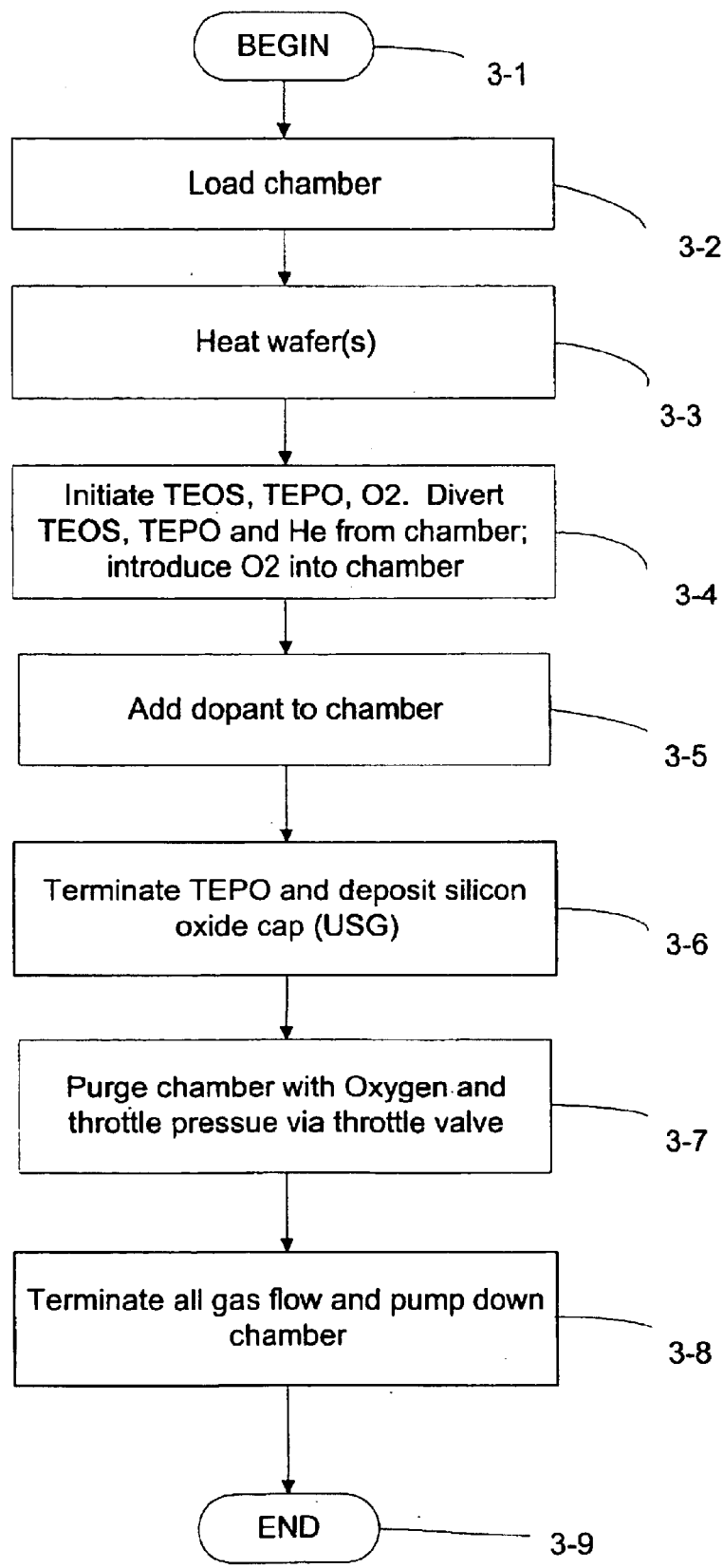
FIG. 3 is a flow chart of a method for depositing a very high phosphorus doped silicon oxide film onto a substrate.

Referring now to FIG. 3, showing therein is a flow chart of a thermal activated SACVD method for depositing a very high phosphorous doped silicon oxide film onto a substrate. The process begins as Step S3–1 and immediately proceeds to Step S3–2. At Step S3–2, chamber 202 is loaded with a silicon wafer.

The present invention is not restricted to performing SACVD on a single wafer, and instead may use a SACVD device that loads multiple wafers at one time. In the preferred embodiment of the present invention, a two-chamber SACVD device is used, having a first chamber and a second chamber allowing the SACVD processing of two wafers simultaneously.

During the loading step, the divert valve 220 is set to the chamber 202 and only a liquefied helium carrier gas is flowing. Next at Step S3–3, the wafer or wafers are heated to a target temperature that will be maintained during the SACVD process. A uniform temperature across a wafer during processing helps ensure homogeneous film composition and properties over its entire area. Target temperature for processing may range between 350° C. and 550° C., but is preferable set to 530° C.

Next at Step S3–4, the divert valve 220 is set to the foreline 208 (around chamber 202) and liquid gas sources TEOS and TEPO (no TEB) are initiated. Thus, a flow of TEOS, TEPO and carrier gas helium from liquid gas sources 212 is diverted into the foreline 208. A pure liquid oxygen ($O_2$) source is initiated into the chamber 202 from oxygen source 210. In a preferred embodiment, oxygen is injected at a flow rate of 8,000 standard cubic centimeters per minute (sccm). Chamber pressure is throttled to a target pressure by control (stepping) the throttle valve 214. In this embodiment, sub-atmospheric pressures are maintained during the SACVD process, and therefore a target pressure is initially set between 20 and 600 Torr, preferably around 200 Torr.

Next at Step S3–5, the liquid gas sources 212 (TESO, TEPO, and He) are diverted into the chamber 202 by controlling the divert valve 220. In this embodiment, liquid injection of $O_2$ at a rate of 8,000 sccm continues during this step. Liquid injection of TEOS is 1200 mgm (milligrams per minute), and liquid injection of TEPO ranges from 140 mgm to 220 mgm, but is preferably 170 mgm. After a specified period of time, phosphorus doping (injection) TEPO is terminated. In order to grow a satisfactory PSG layer, the TEPO doping could last up to 2 minutes. An $O_3$-PSG layer may be grown by replacing the pure oxygen flow with ozone flow (note that ozone is an $O_2$–$O_3$ mixture, of preferably 12.5 weight percent $O_3$).

Figure 4:
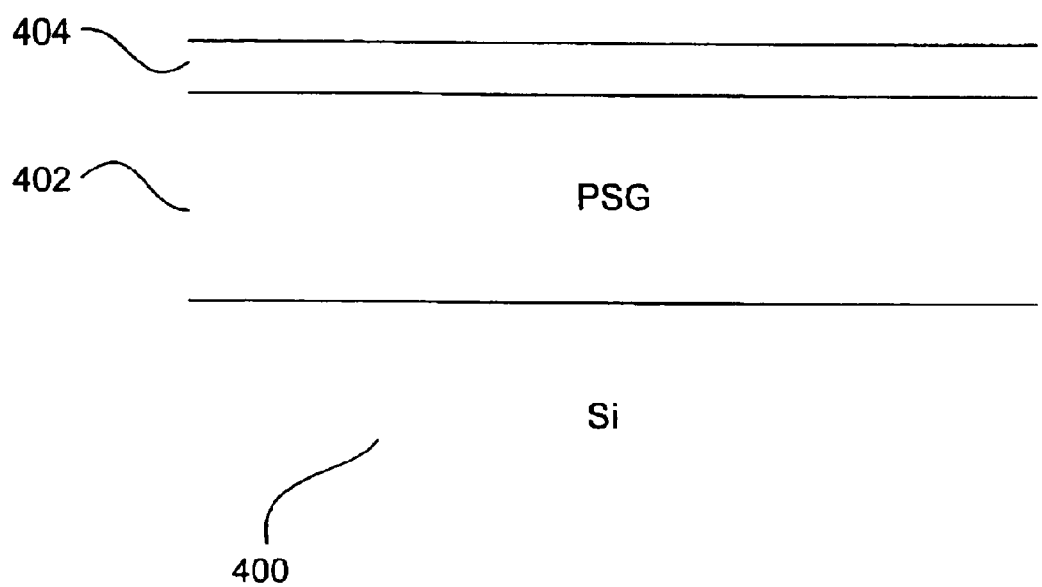
FIG. 4 illustrates a PSG layer deposited on a substrate with a capping layer.

Next, at Step S3–6, an undoped silicon oxide capping layer is deposited by changing the oxygen injection from pure oxygen to ozone, or by any other known means. The deposition of the capping layer is optional in the process, but is preferred because of the added stability to the PSG layer (described in more detail below). Referring to FIG. 4, shown is an exemplary capping layer 404 deposited on a PSG layer 402, deposited on a silicon wafer 400.

After a specified period of time, preferably not to exceed 5 seconds, the process proceeds next to Step 3–7. At Step S3–7, chamber 202 is purged with a mixture of oxygen and ozone while the chamber pressure is maintained at the target pressure. At this step, the ozone mixture is injected at a rate of 8000 sccm, and $O_2$ mixture at a rate of 2000 sccm, while the helium carrier gas is at a rate of −1 sccm, according to a preferred embodiment. After a specified period of time, preferably no more than 5 seconds, the throttle valve is throttled at 1000 steps and purging is continued. After a second specified period of time, preferably no more than 10 seconds, oxygen purging continues while throttle valve is throttled at 1600 steps. During purging, throttling of the throttle valve may be performed at a pressure ramp rate of preferably 35 steps per second and 100 steps per second, respectively. After pressure is throttled to 1600 steps, and after a specified period of time, preferably not to exceed 5 seconds, all gas flows are terminated and the chamber is pumped down with throttle valve fully open at step S3–8. Processing is terminated at Step 3–9.

Purging and the subsequent pumping down of the chamber is crucial to the quality of the subsequent deposition of a BPSG layer on top of the capping layer, which may be performed in the same chamber via any known method of SACVD BPSG deposition (e.g., by using TEB and TEPO as the dopants). Accordingly, by using the preceding method a layer of very high phosphorus concentration PSG film is deposited between or on top of a silicate and below a BPSG layer.

Figure 5A:
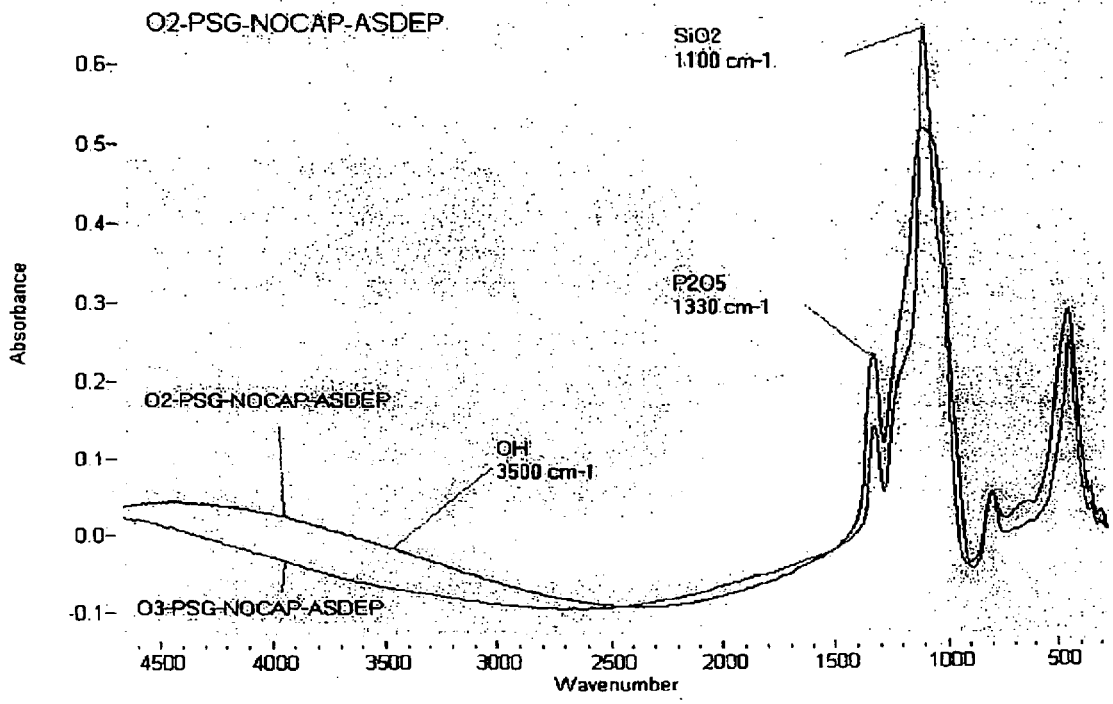
FIG. 5A is a graph of the FTIR spectra of an $O_2$-PSG and an $O_3$-PSG film layer without capping layers as they are taken immediately after deposition.

Referring now to FIGS. 5A–5E, it has been found through experimentation and analysis (e.g., wet chemical analysis) that using pure oxygen as a doping source may produce a film containing a very high phosphorus concentration compared to using an ozone source during the deposition step. In fact, results show that films may be deposited having a phosphorus weight of about 22 weight percent and such films are about 2.2 times richer in phosphorus concentration than $O_3$-PSG films. In addition, $O_2$-PSG films are also higher in refractive index than $O_3$-PSG films. For example, referring now to FIG. 5A, shown is the graph of the results of a Fourier Transform Infrared Resonance (FTIR) spectra of $O_2$-PSG and $O_3$-PSG films without capping layers taken immediately after deposition by the method described above. As shown, the $O_2$-PSG films show stronger $P_2O_5$ peak at 1330 cm$^{-1}$ than for the $O_3$-PSG film. Also, the $P_2O_5/SiO_2$ peak ratio is higher for the $O_2$-PSG than the $O_3$-PSG films.

Figure 5B:
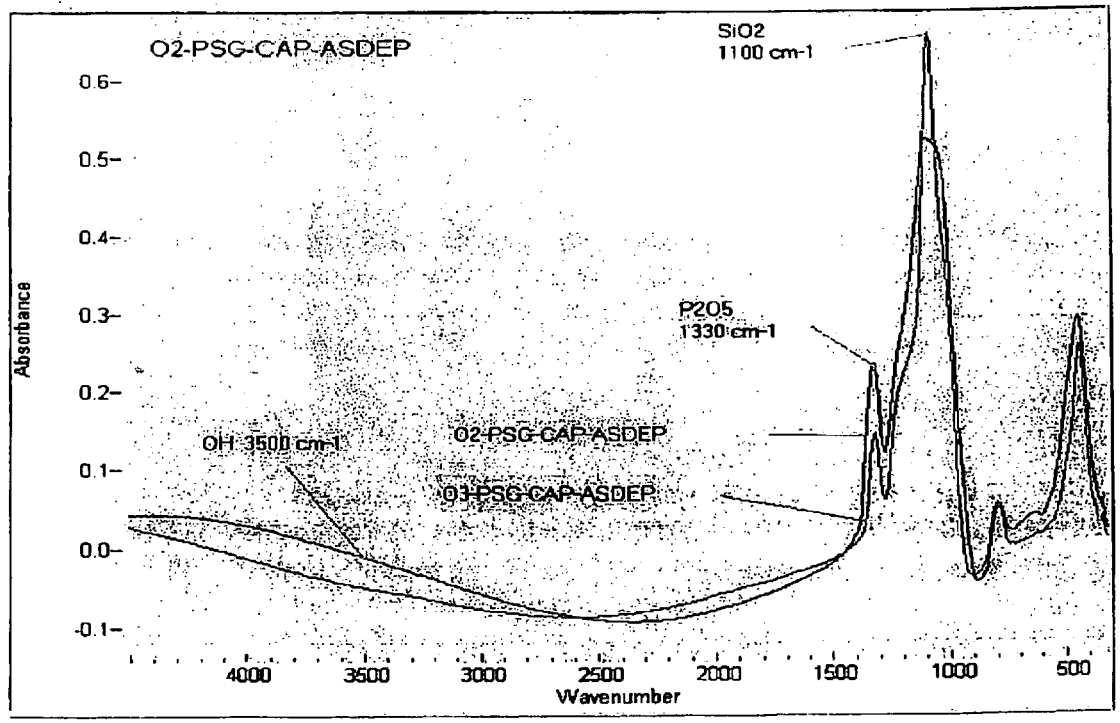
FIG. 5B is a graph of an FTIR spectra of an $O_2$-PSG and an $O_3$-PSG film with capping layers taken immediately after deposition.
Figure 5C:
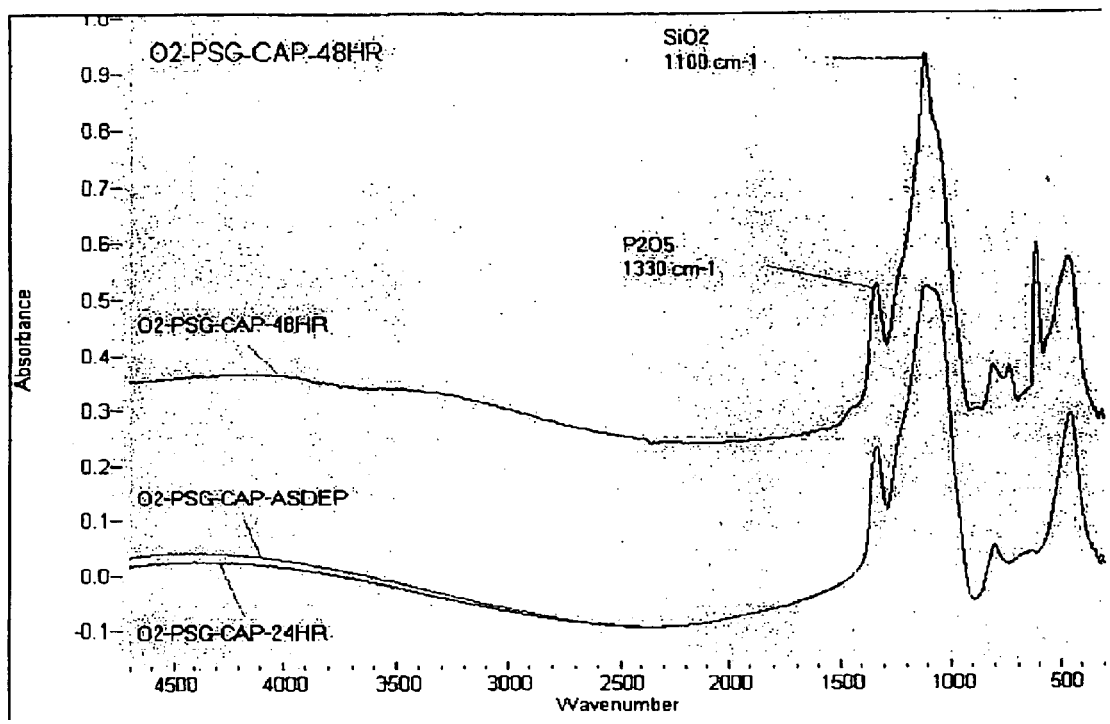
FIG. 5C is a graph of an FTIR spectra of an $O_2$-PSG film with capping layer taken immediately after deposition, 24 hours after deposition, and 48 hours after deposition.
Figure 5D:
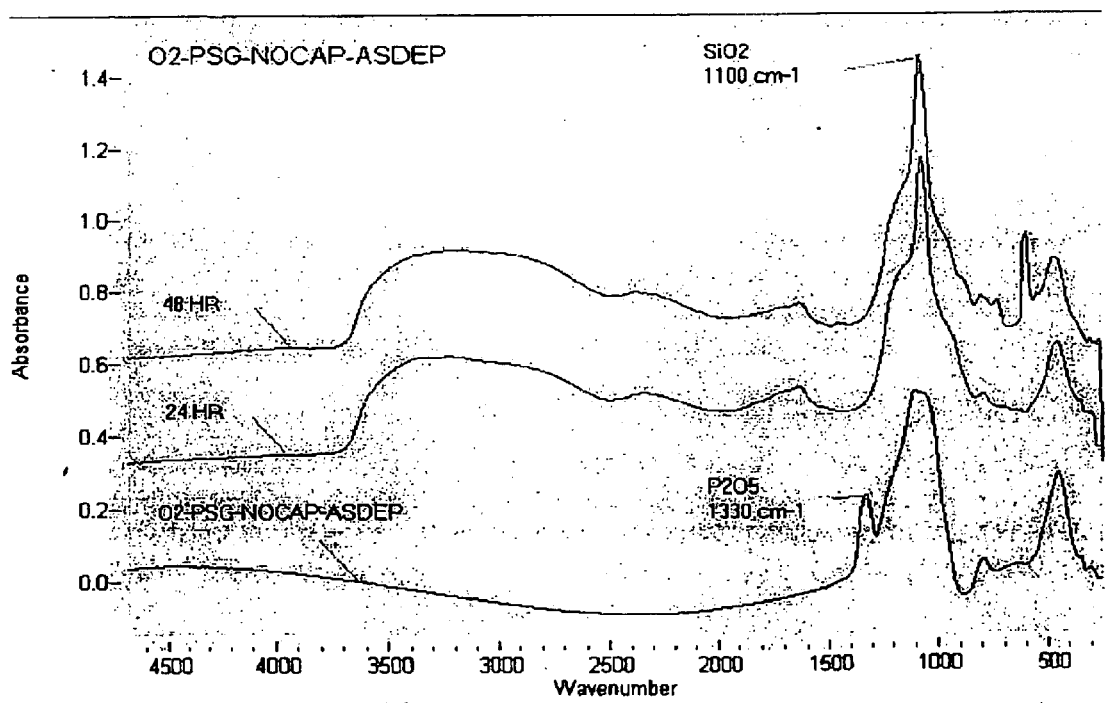
FIG. 5D is a graph of an FTIR spectra of $O_2$-PSG film without capping layer taken immediately after deposition, 24 hours after deposition, and 48 hours after deposition.

FIG. 5B shows the FTIR spectra of the $O_2$-PSG than the $O_3$-PSG films with capping layers taken immediately after deposition. A similar response is shown with a strong $P_2O_5$ peak at 1330 cm$^{-1}$ for the $O_2$-PSG film. FIGS. 5C and 5D show the difference in response for $O_2$-PSG layers with capping layers versus without capping layers immediately after the deposition and over time (i.e., 24 and 48 hours). It is clear from these graphs that the spectra indicates that the $O_2$-PSG film with the capping layer is quite stable for at least the first 24 hours after deposition versus without a capping layer.

Figure 5E:
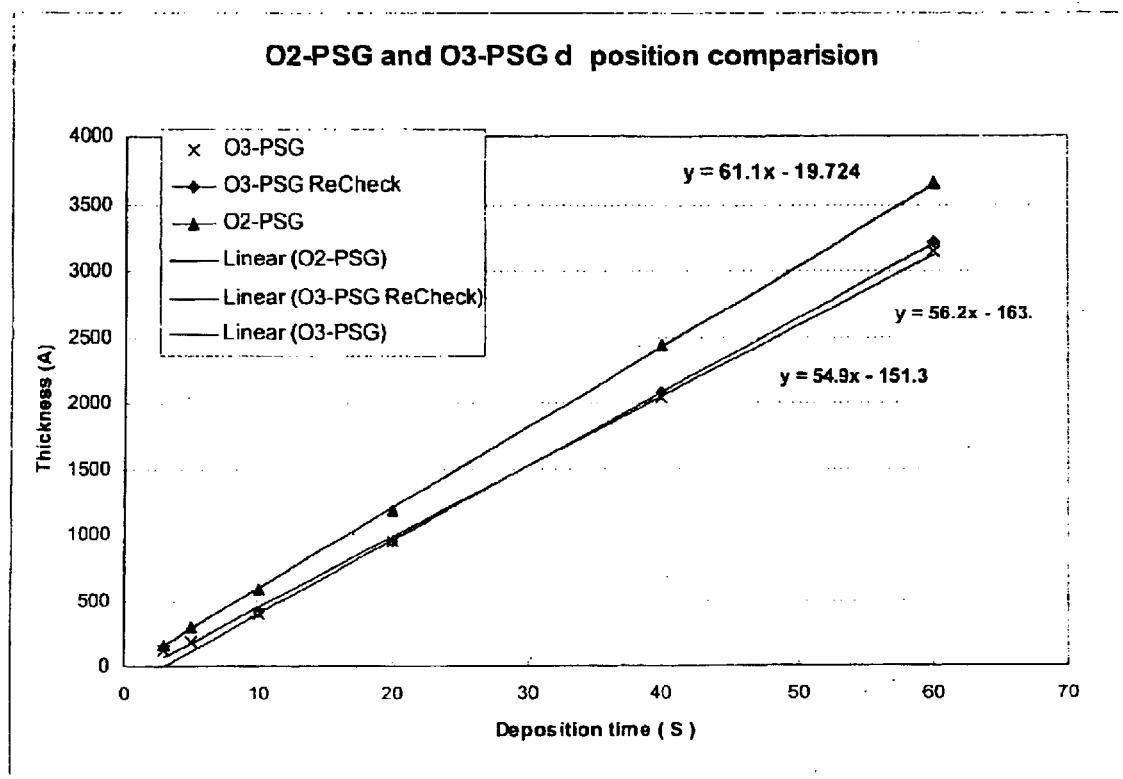
FIG. 5E is a comparison of PSG films using pure oxygen ($O_2$) and an oxygen-ozone mixture.

Referring now to FIG. 5E, shown is a comparison of PSG film deposition thickness versus time using $O_2$ and ozone mixture ($O_2$–$O_3$) during the SACVD process described herein. From the graph, one can see that $O_2$-PSG layers deposition rates are greater than $O_3$-PSG film layers (about 61 A/s vs. about 55 A/s, respectively); and, therefore, the use of $O_2$ will also decrease manufacturing time.

Accordingly, it is shown that by using the methods described herein, a very highly doped phosphorus silicon layer may be deposited onto a substrate in a manner that is both efficient and inexpensive, utilizing currently available technology.

Thus, having fully described the invention by way of example with reference to the attached drawing figures, it will readily be appreciated that many changes and modifications may be made to the invention and to the embodiments disclosed without departing from the scope of the invention as defined by the appended claims.

What is claimed is:

1. A method for depositing a phosphorus doped silicon oxide film, comprising the steps of:

loading a wafer into a chemical deposition device chamber;

introducing a flow of carrier gas into said chamber and throttling the pressuring of said chamber to a first target pressure;

heating said wafer to a target temperature;

terminating said flow of carrier gas into said chamber and introducing a flow of oxygen into said chamber;

introducing a flow of a phosphorus source, a flow of a silicon source and said carrier gas into said chamber;

terminating said flow of said phosphorus source, said flow of said silicon source, said flow of oxygen, and said flow of carrier gas after a predetermined period of time; and purging said chamber.

2. The method of claim 1, wherein said target temperature is between 350 and 550 degrees Celsius.

3. The method of claim 1, wherein said first target pressure is between 20 and 620 Torr.

4. The method of claim 1, wherein said phosphorous source is triethylphosphate (TEPO) and said silicon source is tetraethylorthosilicate (TEOS).

5. The method of claim 1 wherein said chamber is purged with a mix of oxygen and ozone during said purging step.

6. The method of claim 5, wherein said purging step further includes of the steps of:

further throttling the pressure of said chamber to a second target pressure;

waiting a second predetermined period of time.

7. The method of claim 6 wherein after said second predetermined a period of time, throttling the pressure of said chamber to a third target pressure and waiting a third predetermined period of time.

8. The method of claim 7 further comprising the step of pumping down said chamber after said third predetermined period of time.

9. The method of claim 1 further comprising the step of depositing a BPSG layer after said purging step.

* * * * *